(12) United States Patent
Tang

(10) Patent No.: US 11,778,744 B2
(45) Date of Patent: Oct. 3, 2023

(54) PRINTED CIRCUIT BOARD ASSEMBLY AND TERMINAL

(71) Applicant: VIVO MOBILE COMMUNICATION CO., LTD., Guangdong (CN)

(72) Inventor: Houxun Tang, Chang'an Dongguan (CN)

(73) Assignee: VIVO MOBILE COMMUNICATION CO., LTD., Chang'an Dongguan (CN)

( * ) Notice: Subject to any disclaimer, the term of this patent is extended or adjusted under 35 U.S.C. 154(b) by 0 days.

(21) Appl. No.: 17/549,679

(22) Filed: Dec. 13, 2021

(65) Prior Publication Data

US 2022/0104358 A1  Mar. 31, 2022

Related U.S. Application Data

(63) Continuation of application No. PCT/CN2020/084935, filed on Apr. 15, 2020.

(30) Foreign Application Priority Data

Jun. 24, 2019 (CN) .......................... 201910548773.6

(51) Int. Cl.
*H05K 1/14* (2006.01)
*H05K 1/02* (2006.01)

(52) U.S. Cl.
CPC ........... *H05K 1/144* (2013.01); *H05K 1/0216* (2013.01); *H05K 2201/042* (2013.01)

(58) Field of Classification Search
CPC . H05K 1/144; H05K 1/0216; H05K 2201/042

(Continued)

(56) References Cited

U.S. PATENT DOCUMENTS 4,705,205 A  11/1987  Allen et al.
5,760,469 A   6/1998  Higashiguchi et al.
(Continued)

FOREIGN PATENT DOCUMENTS

CN  105472863 A  4/2016
CN  205793635 U  12/2016
(Continued)

OTHER PUBLICATIONS

Chinese Office Action dated Feb. 28, 2020 as received in application No. 201910548773.6.
(Continued)

*Primary Examiner* — Andargie M Aychillhum

(74) *Attorney, Agent, or Firm* — Maschoff Brennan

(57) ABSTRACT

A printed circuit board assembly and a terminal are provided. The printed circuit board assembly includes: a first printed circuit board and a second printed circuit board, where the second printed circuit board is electrically connected to the first printed circuit board through at least four solder joints; the at least four solder joints include a first solder joint, a second solder joint, a third solder joint, and a fourth solder joint, the first solder joint communicates with the second solder joint, the third solder joint communicates with the fourth solder joint, and at least one solder joint and/or at least one printed circuit board cavity is provided between the second solder joint and the third solder joint;

(Continued)

and the printed circuit board cavity is a recess structure that is recessed inwards from a surface of the printed circuit board.

20 Claims, 5 Drawing Sheets

(58) Field of Classification Search
 USPC ......................................................... 361/803
 See application file for complete search history.

(56) References Cited

U.S. PATENT DOCUMENTS

| | | | |
|---|---|---|---|
| 6,163,462 | A | 12/2000 | Buck |
| 7,042,088 | B2 * | 5/2006 | Ho .......................... H01L 24/81 |
| | | | 257/E23.021 |
| 2003/0136579 | A1 | 7/2003 | Searls et al. |
| 2004/0080045 | A1 | 4/2004 | Kimura et al. |
| 2010/0155966 | A1 | 6/2010 | Moden |
| 2015/0237732 | A1 * | 8/2015 | Velez ..................... H05K 1/165 |
| | | | 174/255 |
| 2015/0325543 | A1 | 11/2015 | Katkar et al. |
| 2016/0095218 | A1 * | 3/2016 | Sakurai .................. H05K 3/426 |
| | | | 361/768 |
| 2018/0110122 | A1 * | 4/2018 | Lee ........................ H05K 1/147 |
| 2018/0376582 | A1 * | 12/2018 | Chang .................. H05K 3/4007 |

FOREIGN PATENT DOCUMENTS

| | | |
|---|---|---|
| CN | 206283722 U | 6/2017 |
| CN | 107197587 A | 9/2017 |
| CN | 107613640 A | 1/2018 |
| CN | 107946339 A | 4/2018 |
| CN | 109890137 A | 6/2019 |
| CN | 110312363 A | 10/2019 |
| DE | 102009012643 A1 | 10/2009 |
| JP | H0945809 A | 2/1997 |
| JP | H09260434 A | 10/1997 |
| JP | 2000012732 A | 1/2000 |
| JP | 2002231761 A | 8/2002 |
| JP | 2004152812 A | 5/2004 |
| WO | 2017206594 A1 | 12/2017 |

OTHER PUBLICATIONS

International Search Report and Written Opinion dated Jun. 30, 2020 as received in application No. PCT/CN2020/084935.
Japanese Office Action dated Oct. 11, 2022 as received in application No. 2021-569411.
Extended European Search Report dated Jun. 24, 2022 as received in Application No. 20832668.6.

\* cited by examiner

PRINTED CIRCUIT BOARD ASSEMBLY AND TERMINAL

CROSS-REFERENCE TO RELATED APPLICATIONS

This application is continuation application of PCT International Application No. PCT/CN2020/084935 filed on Apr. 15, 2020, which claims priority to Chinese Patent Application No. 201910548773.6, filed in China on Jun. 24, 2019, the disclosures of which are incorporated herein by reference in their entireties.

TECHNICAL FIELD

This disclosure relates to the field of terminal technologies, and in particular, to a printed circuit board assembly and a terminal.

BACKGROUND

With the emergence and application of the fifth generation (5G) mobile communication, increasing electronic devices need to be carried on a printed circuit board (PCB) of a mobile terminal such as a smart phone. Due to the increasing power consumption, increasingly high requirements are imposed on the capacity and size of a battery. As a result, the PCB area in a space defined by the X and Y axes is becoming increasingly inadequate. At present, some products attempt to stack two or more PCBs in a Z-axis direction, as shown in FIG. 1 (a represents a shielding case, b represents an electronic component, c represents a solder ball, d represents a first PCB, e represents an intermediate connecting support board, and f represents a second PCB), so as to use the space in the Z-axis direction to expand the usable area of the PCBs. The intermediate connecting support board functions to provide signal connection and electromagnetic shielding.

Solder balls are provided on both upper and lower sides of the intermediate connecting support board, and the solder balls are soldered to corresponding solder pads on the first PCB and the second PCB. These solder balls bear most of the stress of the intermediate connecting support board, and consequently, a single solder joint bears a large stress and is failure-prone in particular application scenarios.

SUMMARY

An objective of embodiments of this disclosure is to provide a printed circuit board assembly and a terminal.

According to a first aspect, an embodiment of this disclosure provides a printed circuit board assembly, including:
a first printed circuit board; and
a second printed circuit board, where the second printed circuit board is electrically connected to the first printed circuit board through at least four solder joints;
the at least four solder joints include a first solder joint, a second solder joint, a third solder joint, and a fourth solder joint that are sequentially arranged in a predetermined direction, the first solder joint communicates with the second solder joint, the third solder joint communicates with the fourth solder joint, and at least one solder joint and/or at least one printed circuit board cavity is provided between the second solder joint and the third solder joint; and
the printed circuit board cavity is a recess structure that is recessed inwards from a surface of the printed circuit board.

Optionally, the at least one solder joint provided between the second solder joint and the third solder joint is electrically connected to the first printed circuit board and the second printed circuit board.

Optionally, the first printed circuit board is electrically connected to the second printed circuit board through a third printed circuit board;
the at least four solder joints further include a fifth solder joint, a sixth solder joint, a seventh solder joint, and an eighth solder joint that are sequentially arranged in a predetermined direction, the fifth solder joint communicates with the sixth solder joint, the seventh solder joint communicates with the eighth solder joint, and at least one solder joint and/or at least one printed circuit board cavity is provided between the sixth solder joint and the seventh solder joint; and
the third printed circuit board includes a first end face and a second end face, the first end face is electrically connected to a third end face of the first printed circuit board through the first solder joint, the second solder joint, the third solder joint, and the fourth solder joint, and the second end face is electrically connected to a fourth end face of the second printed circuit board through the fifth solder joint, the sixth solder joint, the seventh solder joint, and the eighth solder joint.

Optionally, the at least one solder joint provided between the first end face and the third end face of the first printed circuit board is electrically connected to the first end face and the third end face; and/or
the at least one solder joint provided between the second end face and the fourth end face of the second printed circuit board is electrically connected to the second end face and the fourth end face of the second printed circuit board.

Optionally, at least one printed circuit board cavity is provided in the third end face; and/or
at least one printed circuit board cavity is provided in the fourth end face of the second printed circuit board; and/or
at least one printed circuit board cavity is provided in the first end face of the third printed circuit board; and/or
at least one printed circuit board cavity is provided in the second end face of the third printed circuit board.

Optionally, in a case that a solder joint and a printed circuit board cavity are both provided between the second solder joint and the third solder joint, the solder joint and the printed circuit board cavity are arranged alternately.

Optionally, the printed circuit board cavity is located between the solder joint and the second solder joint; and/or
the printed circuit board cavity is located between the solder joint and the third solder joint.

Optionally, through-holes are provided in the third printed circuit board, and the solder joints on the first end face communicate with the solder joints on the second end face via the through-holes.

Optionally, in a case that only a solder joint is provided between the second solder joint and the third solder joint, the solder joint is away from the second solder joint by a distance greater than or equal to a preset threshold; and/or
the solder joint is away from the third solder joint by a distance greater than or equal to the preset threshold.

Optionally, in a case that only the printed circuit board cavity is provided between the second solder joint and the third solder joint, the printed circuit board cavity occupies an entire gap between the second solder joint and the third solder joint.

According to a second aspect, an embodiment of this disclosure further provides a terminal, including the foregoing printed circuit board assembly.

DETAILED DESCRIPTION OF THE EMBODIMENTS

Figure 1:
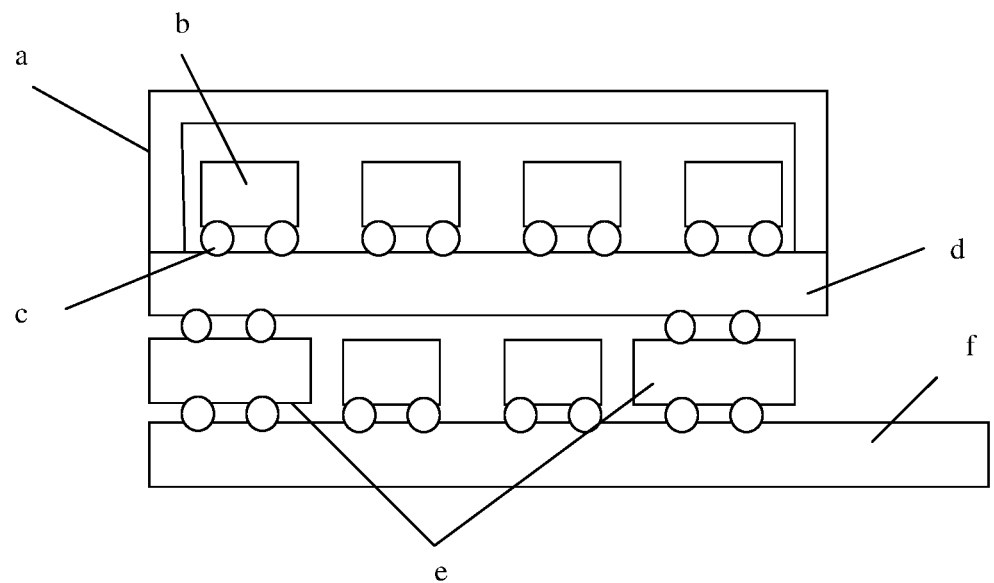
FIG. 1 is a schematic diagram of PCB stacking in the related art.

The following clearly describes the technical solutions in the embodiments of this disclosure with reference to the accompanying drawings in the embodiments of this disclosure. Apparently, the described embodiments are some rather than all of the embodiments of this disclosure. All other embodiments obtained by a person of ordinary skill in the art based on the embodiments of this disclosure shall fall within the protection scope of this disclosure.

This disclosure provides a printed circuit board assembly, to resolve the related-art problem that a single solder joint on a printed circuit board assembly bears a larger stress and is prone to failure. As shown in FIG. 2 to FIG. 8, the printed circuit board assembly includes:

a first printed circuit board 1; and a second printed circuit board 2, where the second printed circuit board 2 is electrically connected to the first printed circuit board 1 through at least four solder joints;

the at least four solder joints include a first solder joint 3, a second solder joint 4, a third solder joint 5, and a fourth solder joint 6 that are sequentially arranged in a predetermined direction, the first solder joint 3 communicates with the second solder joint 4, the third solder joint 5 communicates with the fourth solder joint 6, and at least one solder joint 7 and/or at least one printed circuit board cavity 8 is provided between the second solder joint 4 and the third solder joint 5; and the printed circuit board cavity 8 is a recess structure that is recessed inwards from a surface of the printed circuit board.

It is explained herein that the solder joint 7 is connected neither to the second solder joint 4 nor to the third solder joint 5.

In the printed circuit board assembly according to this embodiment of this disclosure, the first printed circuit board and the second printed circuit board are disposed, where the second printed circuit board is electrically connected to the first printed circuit board through at least four solder joints; the at least four solder joints include a first solder joint, a second solder joint, a third solder joint, and a fourth solder joint that are sequentially arranged in a predetermined direction, the first solder joint communicates with the second solder joint, the third solder joint communicates with the fourth solder joint, and at least one solder joint and/or at least one printed circuit board cavity is provided between the second solder joint and the third solder joint; and the printed circuit board cavity is a recess structure that is recessed inwards from a surface of the printed circuit board. This can disperse a stress on a single solder joint while providing electromagnetic shielding for signals of inner solder joints. This can also increase gaps between the solder joints, including gaps in X, Y, and Z directions, while maintaining the capability to disperse the stress on solder joints and providing electromagnetic shielding, thereby increasing the space for solder flux volatilization, avoiding electromigration along a remaining solder flux channel between adjacent solder joints in a particular environment, and enhancing electromigration resistance. Therefore, the related-art problem that a single solder joint on a printed circuit board assembly bears a larger stress and is failure-prone is well resolved.

As shown in FIG. 2 to FIG. 8, the at least one solder joint 7 provided between the second solder joint 4 and the third solder joint 5 is electrically connected to the first printed circuit board 1 and the second printed circuit board 2.

This can ensure normal communication between the first printed circuit board and the second printed circuit board.

To expand a usable area of the PCB, as shown in FIG. 3 to FIG. 8, the first printed circuit board 1 is electrically connected to the second printed circuit board 2 through a third printed circuit board 9; the at least four solder joints further include a fifth solder joint 10, a sixth solder joint 11, a seventh solder joint 12, and an eighth solder joint 13 that are sequentially arranged in a predetermined direction, the fifth solder joint 10 communicates with the sixth solder joint 11, the seventh solder joint 12 communicates with the eighth solder joint 13, and at least one solder joint 14 and/or at least one printed circuit board cavity 15 is provided between the sixth solder joint 11 and the seventh solder joint 12; and the third printed circuit board 9 includes a first end face and a second end face, the first end face is electrically connected to a third end face of the first printed circuit board 1 through the first solder joint 3, the second solder joint 4, the third solder joint 5, and the fourth solder joint 6, and the second end face is electrically connected to a fourth end face of the second printed circuit board 2 through the fifth solder joint 10, the sixth solder joint 11, the seventh solder joint 12, and the eighth solder joint 13.

It is explained herein that the solder joint 7 is connected neither to the sixth solder joint 11 nor to the seventh solder joint 12. The third printed circuit board serves as an intermediate connecting support board.

As shown in FIG. 3 to FIG. 8, the at least one solder joint 7 provided between the first end face and the third end face of the first printed circuit board 1 is electrically connected to the first end face and the third end face; and/or the at least one solder joint 14 provided between the second end face and the fourth end face of the second printed circuit board 2 is electrically connected to the second end face and the fourth end face of the second printed circuit board.

This can ensure normal communication between the first printed circuit board and the second printed circuit board.

As shown in FIG. 3 to FIG. 8, a printed circuit board cavity 8 is provided in the third end face (that is, an end face facing the third printed circuit board), and/or a printed circuit board cavity 15 is provided in the fourth end face of the second printed circuit board (that is, an end face facing the third printed circuit board), and/or a printed circuit board cavity 8 is provided in the first end face of the third printed circuit board, and/or a printed circuit board cavity 15 is provided in the second end face of the third printed circuit board.

Figure 3:
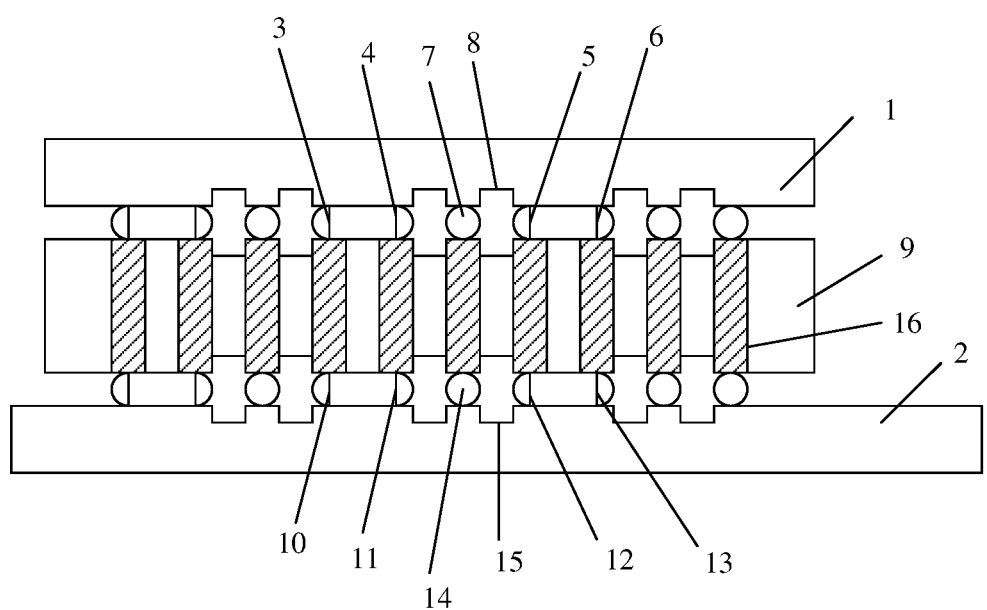
FIG. 3 is a second schematic structural diagram of a printed circuit board assembly according to an embodiment of this disclosure.
Figure 4:
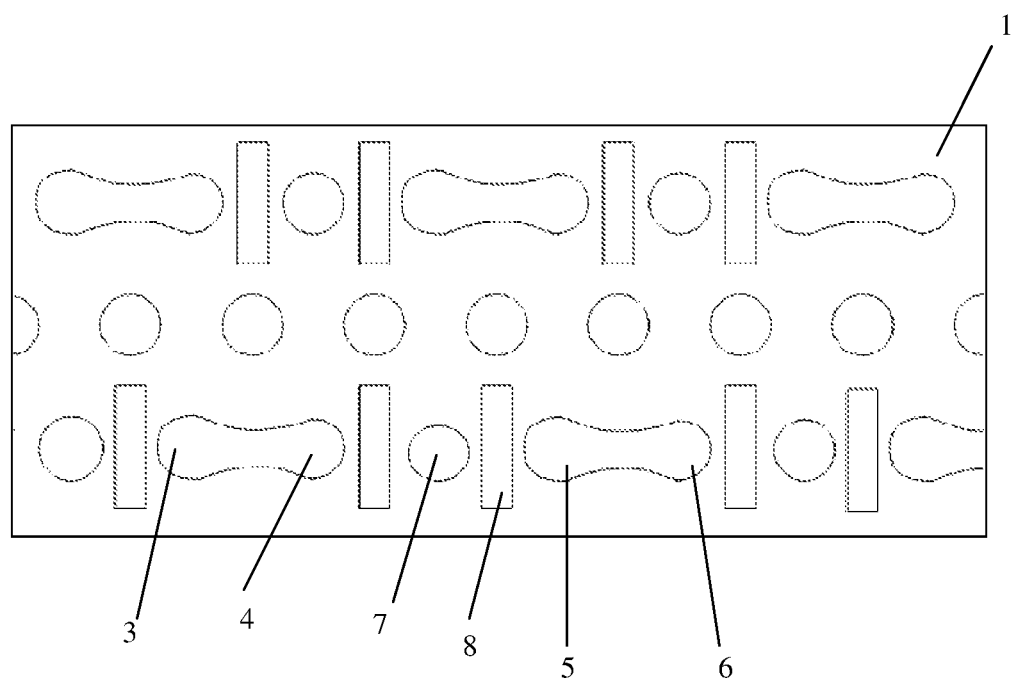
FIG. 4 is a third schematic structural diagram of a printed circuit board assembly according to an embodiment of this disclosure.

As shown in FIG. 3 and FIG. 4, in a case that a solder joint 7 and a printed circuit board cavity 8 are both provided between the second solder joint 4 and the third solder joint 5, the solder joint 7 and the printed circuit board cavity 8 are arranged alternately.

This can facilitate volatilization of residual solder flux.

As shown in FIG. 3 and FIG. 4, the printed circuit board cavity 8 is located between the solder joint 7 and the second solder joint 4; and/or the printed circuit board cavity 8 is located between the solder joint 7 and the third solder joint 5.

This can further facilitate the volatilization of residual solder flux.

Figure 5:
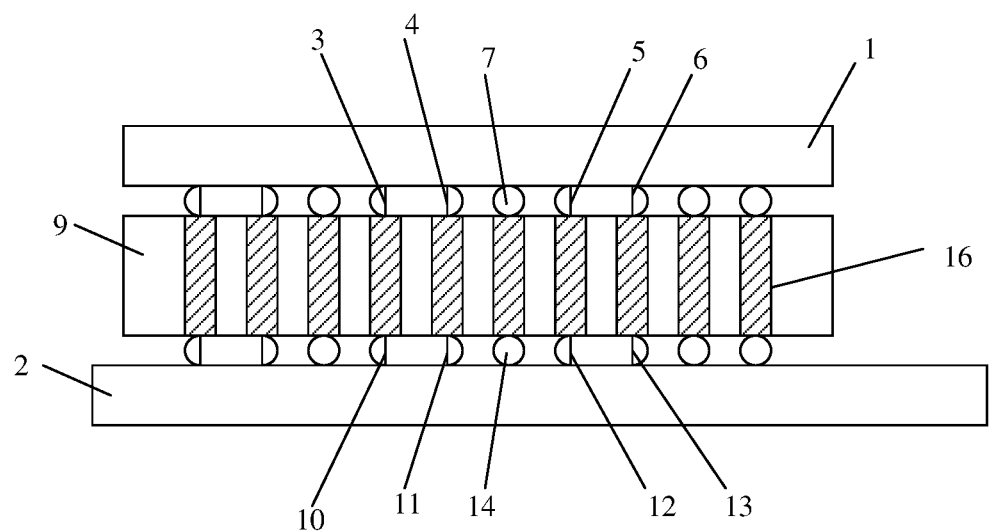
FIG. 5 is a fourth schematic structural diagram of a printed circuit board assembly according to an embodiment of this disclosure.
Figure 7:
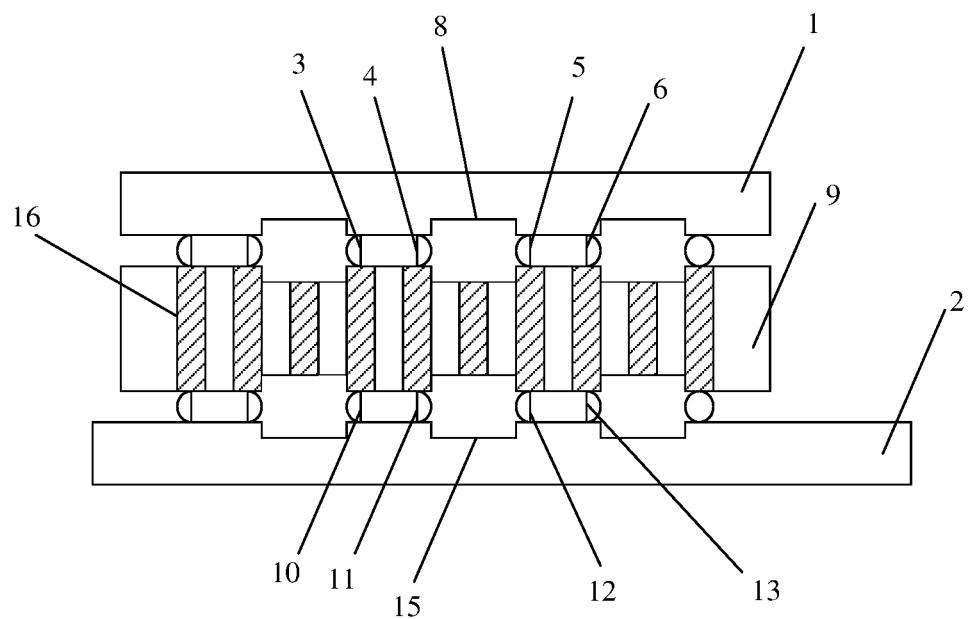
FIG. 7 is a sixth schematic structural diagram of a printed circuit board assembly according to an embodiment of this disclosure.

As shown in FIG. 3, FIG. 5, and FIG. 7, through-holes 16 are provided in the third printed circuit board 9, and the solder joints on the first end face (including the first solder joint 3, the second solder joint 4, the third solder joint 5, the fourth solder joint 6, and the solder joint 7) communicate with the solder joints on the second end face (including the fifth solder joint 10, the sixth solder joint 11, the seventh solder joint 12, the eighth solder joint 13, and the solder joint 14) via the through-holes 16.

This can ensure normal communication between the first printed circuit board and the second printed circuit board.

Figure 6:
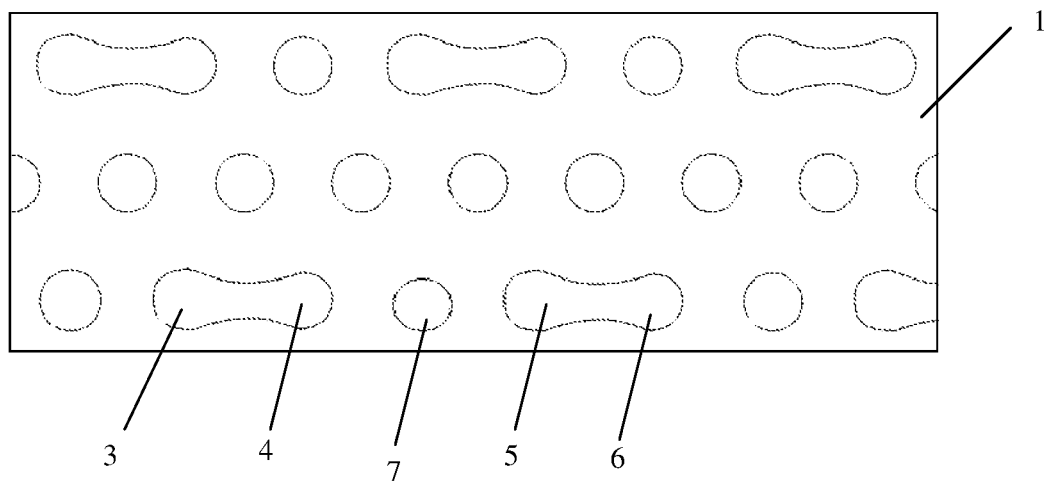
FIG. 6 is a fifth schematic structural diagram of a printed circuit board assembly according to an embodiment of this disclosure.

As shown in FIG. 5 and FIG. 6, in a case that only a solder joint 7 is provided between the second solder joint 4 and the third solder joint 5, the solder joint 7 is away from the second solder joint 4 by a distance greater than or equal to a preset threshold; and/or the solder joint 7 is away from the third solder joint 5 by a distance greater than or equal to the preset threshold.

This can facilitate the volatilization of residual solder flux.

Figure 8:
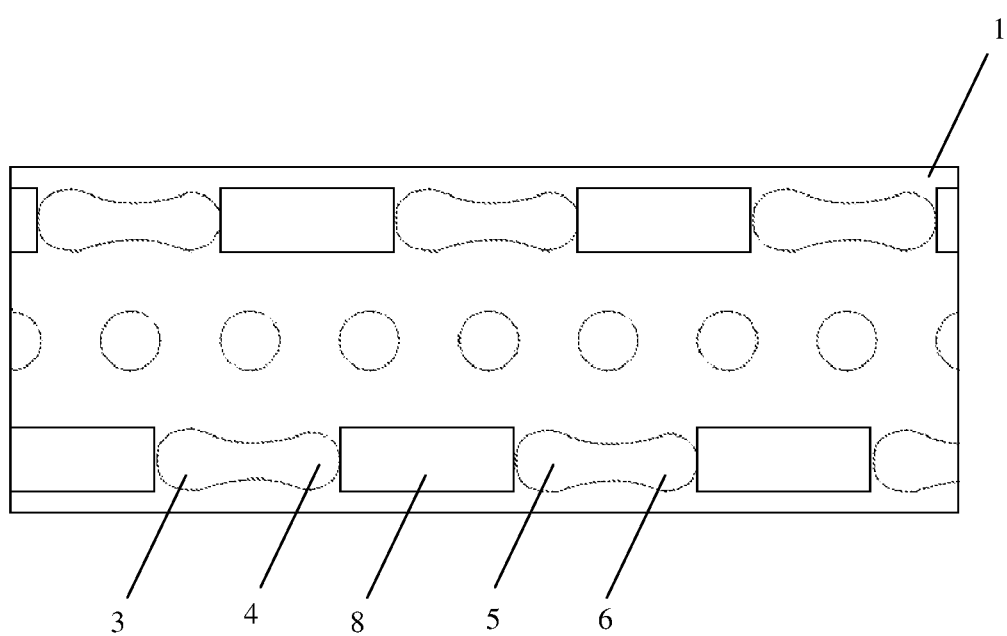
FIG. 8 is a seventh schematic structural diagram of a printed circuit board assembly according to an embodiment of this disclosure.

As shown in FIG. 7 and FIG. 8, in a case that only the printed circuit board cavity 8 is provided between the second solder joint 4 and the third solder joint 5, the printed circuit board cavity occupies an entire gap between the second solder joint and the third solder joint.

This can facilitate the volatilization of residual solder flux to the most extent.

It is explained herein that other configurations of the fifth solder joint 10, the sixth solder joint 11, the seventh solder joint 12, and the eighth solder joint 13 are similar to those of the first solder joint 3, the second solder joint 4, the third solder joint 5, and the fourth solder joint 6, and details are not described herein.

The following further describes the printed circuit board assembly according to this embodiment of this disclosure.

In view of the foregoing technical problem, solder joints of a same network may be arranged on an outer side, and two adjacent solder joints are connected, so as to disperse a stress on a single solder joint and provide electromagnetic shielding for signals of solder joints on an inner side. However, solder flux is required to ensure the soldering quality during soldering of a third dimensional printed circuit board assembly (3DPCBA). After the soldering is completed, the solder flux will volatilize to an external space through the surrounding gap. However, because two adjacent solder joints on the outer side are connected and soldered together, no sufficient gap is available for the solder flux on the inner side to volatilize, and consequently the residual solder flux around the solder joints cannot volatilize. In this case, when a voltage difference exists between solder joints of different networks, in a particular environment, electromigration occurs along a remaining solder flux channel between adjacent solder joints, eventually leading to a short circuit between different networks. Therefore, this embodiment of this disclosure provides a printed circuit board assembly, to increase gaps between the solder joints, including gaps in the X, Y, and Z directions, while maintaining the capability to disperse the stress on the solder joints and providing electromagnetic shielding, thereby increasing the space for solder flux volatilization and enhancing electromigration resistance.

Specifically, the following two points are involved:

First, connection design of the solder joints on the outer side is optimized from a connection of two adjacent solder joints to a connection spaced by one solder joint, thereby increasing the gaps between the solder joints in the X and Y directions, as shown in FIG. 2 to FIG. 6.

Second, corresponding PCB cavities are added to the PCB around the outer solder joints, to increase the gap between the solder joints in the Z direction, as shown in FIG. 2 to FIG. 4, FIG. 7, and FIG. 8.

As for the first point:

In terms of the connection design of the outer solder joints, the direct connection of every two adjacent solder joints is optimized by adding a separate solder joint between two groups of directly connected adjacent solder joints. Solder paste is applied to the connected area and the separate solder joints, to solder the three PCBs, thereby increasing the gaps between the solder joints in the X and Y directions, as shown in FIG. 2 to FIG. 6.

Figure 2:
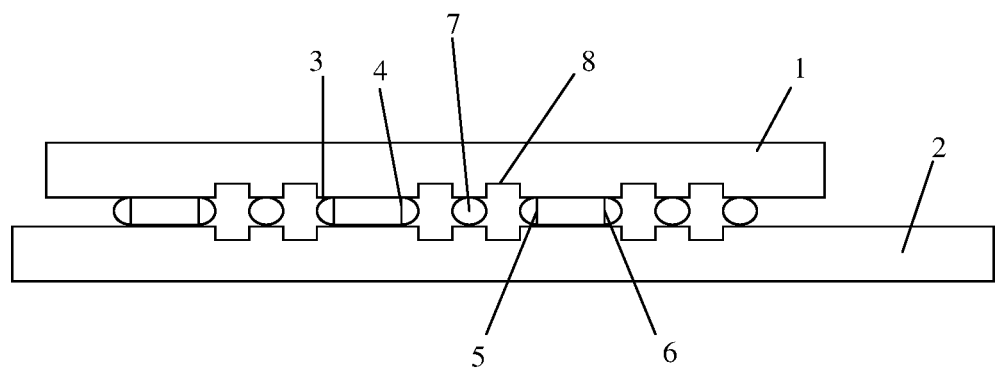
FIG. 2 is a first schematic structural diagram of a printed circuit board assembly according to an embodiment of this disclosure.

As for the second point:

On the basis of the first point, PCB cavities may be added around the solder joints. The cavity area does not allow soldering, so that the gap between the solder joints in the Z direction can be further increased without affecting soldering strength and stress distribution, as shown in FIG. 2 to FIG. 4.

Optionally, the second point can be separately implemented, that is, the separate solder joint between two adjacent groups of connected solder joints may be replaced by the PCB cavity. Further, the PCB cavity between two adjacent groups of connected solder joints may occupy an entire gap between the two groups of connected solder joints, as shown in FIG. 7 and FIG. 8.

In this way, the presence of the cavity increases the gap between the PCB and the intermediate connecting support board, facilitating solder flux volatilization, reducing residual solder flux, and decreasing the risk of electromigration in soldering.

Therefore, the solution provided in the embodiments of this disclosure can increase the space for solder flux volatilization by increasing the gaps between the solder joints, including the gaps in the X, Y, and Z directions, thereby enhancing the electromigration resistance.

It is explained herein that the structure in the solution is not limited to a two-layer PCB stacking structure (for example, the first PCB and the second PCB that are connected by using the third PCB in between), and may be extended to a multi-layer stacking structure of three or more layers of PCBs.

An embodiment of this disclosure further provides a terminal, including the foregoing printed circuit board assembly.

The terminal according to this embodiment of this application can implement all processes and functions performed by the printed circuit board assembly shown in FIG. 1 to FIG. 8. To avoid repetition, details are not described herein.

It should be noted that in this specification, the term "comprise", "include", or any other variant thereof is intended to cover a non-exclusive inclusion, so that a process, a method, an article, or an apparatus that includes a list of elements not only includes those elements but also includes other elements that are not expressly listed, or further includes elements inherent to such process, method, article, or apparatus. In absence of more constraints, an element preceded by "includes a . . . " does not preclude the existence of other identical elements in the process, method, article, or apparatus that includes the element. In addition, the use of "and/or" in this application represents presence of at least one of the connected objects. For example, A and/or B and/or C represents the following seven cases: A alone, B alone, C alone, both A and B, both B and C, both A and C, and all of A, B, and C.

The embodiments of this disclosure are described above with reference to the accompanying drawings, but this disclosure is not limited to these embodiments. These embodiments are only illustrative rather than restrictive. Inspired by this disclosure, a person of ordinary skill in the art can still derive a plurality of variations without departing from the essence of this disclosure and the protection scope of the claims. All these variations shall fall within the protection of this disclosure.

What is claimed is:

1. A printed circuit board assembly, comprising:
   a first printed circuit board; and
   a second printed circuit board, wherein the second printed circuit board is electrically connected to the first printed circuit board through at least four solder joints;
   the at least four solder joints comprise a first solder joint, a second solder joint, a third solder joint, and a fourth solder joint that are sequentially arranged in a predetermined direction, the first solder joint communicates with the second solder joint, the third solder joint communicates with the fourth solder joint, and at least one solder joint and/or at least one printed circuit board cavity is provided between the second solder joint and the third solder joint; and
   the printed circuit board cavity is a recess structure that is recessed inwards from a surface of the printed circuit board.

2. The printed circuit board assembly according to claim 1, wherein the at least one solder joint provided between the second solder joint and the third solder joint is electrically connected to the first printed circuit board and the second printed circuit board.

3. The printed circuit board assembly according to claim 1, wherein the first printed circuit board is electrically connected to the second printed circuit board through a third printed circuit board;
   the at least four solder joints further comprise a fifth solder joint, a sixth solder joint, a seventh solder joint, and an eighth solder joint that are sequentially arranged in a predetermined direction, the fifth solder joint communicates with the sixth solder joint, the seventh solder joint communicates with the eighth solder joint, and at least one solder joint and/or at least one printed circuit board cavity is provided between the sixth solder joint and the seventh solder joint; and
   the third printed circuit board comprises a first end face and a second end face, the first end face is electrically connected to a third end face of the first printed circuit board through the first solder joint, the second solder joint, the third solder joint, and the fourth solder joint, and the second end face is electrically connected to a fourth end face of the second printed circuit board through the fifth solder joint, the sixth solder joint, the seventh solder joint, and the eighth solder joint.

4. The printed circuit board assembly according to claim 3, wherein the at least one solder joint provided between the second solder joint and the third solder joint is electrically connected to the first end face and the third end face of the first printed circuit board; and/or
   the at least one solder joint provided between the sixth solder joint and the seventh solder joint is electrically connected to the second end face and the fourth end face of the second printed circuit board.

5. The printed circuit board assembly according to claim 3, wherein at least one printed circuit board cavity provided between the second solder joint and the third solder joint is provided in the third end face; and/or
   at least one printed circuit board cavity provided between the sixth solder joint and the seventh solder joint is provided in the fourth end face of the second printed circuit board; and/or
   at least one printed circuit board cavity provided between the second solder joint and the third solder joint is provided in the first end face of the third printed circuit board; and/or
   at least one printed circuit board cavity provided between the sixth solder joint and the seventh solder joint is provided in the second end face of the third printed circuit board.

6. The printed circuit board assembly according to claim 1, wherein in a case that a solder joint and a printed circuit board cavity are both provided between the second solder joint and the third solder joint, the solder joint and the printed circuit board cavity are arranged alternately.

7. The printed circuit board assembly according to claim 6, wherein the printed circuit board cavity is located between the second solder joint and the solder joint provided between the second solder joint and the third solder joint; and/or
   the printed circuit board cavity is located between the third solder joint and the solder joint provided between the second solder joint and the third solder joint.

8. The printed circuit board assembly according to claim 3, wherein through-holes are provided in the third printed circuit board, and the solder joints on the first end face communicate with the solder joints on the second end face via the through-holes.

9. The printed circuit board assembly according to claim 1, wherein in a case that only a solder joint is provided between the second solder joint and the third solder joint, the solder joint provided between the second solder joint and the third solder joint is away from the second solder joint by a distance greater than or equal to a preset threshold; and/or
   the solder joint provided between the second solder joint and the third solder joint is away from the third solder joint by a distance greater than or equal to the preset threshold.

10. The printed circuit board assembly according to claim 1, wherein in a case that only the printed circuit board cavity is provided between the second solder joint and the third solder joint, the printed circuit board cavity occupies an entire gap between the second solder joint and the third solder joint.

11. A terminal, comprising a printed circuit board assembly, wherein the printed circuit board assembly comprises:
   a first printed circuit board; and
   a second printed circuit board, wherein the second printed circuit board is electrically connected to the first printed circuit board through at least four solder joints;
   the at least four solder joints comprise a first solder joint, a second solder joint, a third solder joint, and a fourth solder joint that are sequentially arranged in a predetermined direction, the first solder joint communicates with the second solder joint, the third solder joint communicates with the fourth solder joint, and at least one solder joint and/or at least one printed circuit board cavity is provided between the second solder joint and the third solder joint; and
   the printed circuit board cavity is a recess structure that is recessed inwards from a surface of the printed circuit board.

12. The terminal according to claim 11, wherein the at least one solder joint provided between the second solder joint and the third solder joint is electrically connected to the first printed circuit board and the second printed circuit board.

13. The terminal according to claim 11, wherein the first printed circuit board is electrically connected to the second printed circuit board through a third printed circuit board;
   the at least four solder joints further comprise a fifth solder joint, a sixth solder joint, a seventh solder joint, and an eighth solder joint that are sequentially arranged in a predetermined direction, the fifth solder joint communicates with the sixth solder joint, the seventh solder joint communicates with the eighth solder joint, and at least one solder joint and/or at least one printed circuit board cavity is provided between the sixth solder joint and the seventh solder joint; and
   the third printed circuit board comprises a first end face and a second end face, the first end face is electrically connected to a third end face of the first printed circuit board through the first solder joint, the second solder joint, the third solder joint, and the fourth solder joint, and the second end face is electrically connected to a fourth end face of the second printed circuit board through the fifth solder joint, the sixth solder joint, the seventh solder joint, and the eighth solder joint.

14. The terminal according to claim 13, wherein the at least one solder joint provided between the second solder joint and the third solder joint is electrically connected to the first end face and the third end face of the first printed circuit board; and/or
   the at least one solder joint provided between the sixth solder joint and the seventh solder joint is electrically connected to the second end face and the fourth end face of the second printed circuit board.

15. The terminal according to claim 13, wherein at least one printed circuit board cavity provided between the second solder joint and the third solder joint is provided in the third end face; and/or
   at least one printed circuit board cavity provided between the sixth solder joint and the seventh solder joint is provided in the fourth end face of the second printed circuit board; and/or
   at least one printed circuit board cavity provided between the second solder joint and the third solder joint is provided in the first end face of the third printed circuit board; and/or
   at least one printed circuit board cavity provided between the sixth solder joint and the seventh solder joint is provided in the second end face of the third printed circuit board.

16. The terminal according to claim 11, wherein in a case that a solder joint and a printed circuit board cavity are both provided between the second solder joint and the third solder joint, the solder joint and the printed circuit board cavity are arranged alternately.

17. The terminal according to claim 16, wherein the printed circuit board cavity is located between the second solder joint and the solder joint provided between the second solder joint and the third solder joint; and/or
   the printed circuit board cavity is located between the third solder joint and the solder joint provided between the second solder joint and the third solder joint.

18. The terminal according to claim 13, wherein through-holes are provided in the third printed circuit board, and the solder joints on the first end face communicate with the solder joints on the second end face via the through-holes.

19. The terminal according to claim 11, wherein in a case that only a solder joint is provided between the second solder joint and the third solder joint, the solder joint provided between the second solder joint and the third solder joint is away from the second solder joint by a distance greater than or equal to a preset threshold; and/or
   the solder joint provided between the second solder joint and the third solder joint is away from the third solder joint by a distance greater than or equal to the preset threshold.

20. The terminal according to claim 11, wherein in a case that only the printed circuit board cavity is provided between the second solder joint and the third solder joint, the printed circuit board cavity occupies an entire gap between the second solder joint and the third solder joint.

* * * * *